United States Patent
Chun

(10) Patent No.: US 7,763,537 B2
(45) Date of Patent: Jul. 27, 2010

(54) METAL INTERCONNECTION OF SEMICONDUCTOR DEVICE AND METHOD FOR FORMING THE SAME

(75) Inventor: In Kyu Chun, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 472 days.

(21) Appl. No.: 11/612,638

(22) Filed: Dec. 19, 2006

(65) Prior Publication Data

US 2007/0152335 A1   Jul. 5, 2007

(30) Foreign Application Priority Data

Dec. 29, 2005  (KR) ............... 10-2005-0134403

(51) Int. Cl.
*H01L 21/4763* (2006.01)
(52) U.S. Cl. ............... 438/622; 438/629; 438/687; 438/700; 257/E21.214
(58) Field of Classification Search ......... 438/627, 438/637, 638, 639, 672, 670, 671, 668, 697, 438/622, 620, 634, 624, 626, 629, 691, 687, 438/633, 631, 700; 257/E23.01, E21.214
See application file for complete search history.

(56) References Cited

U.S. PATENT DOCUMENTS 7,348,272 B2 * 3/2008 Sung ..................... 438/624

FOREIGN PATENT DOCUMENTS

KR  10-1996-0077707  1/2000
KR  10-2003-0008202  8/2004

* cited by examiner

*Primary Examiner*—Hoa B Trinh
(74) *Attorney, Agent, or Firm*—Saliwanchik Lloyd & Saliwanchik

(57) ABSTRACT

Disclosed are a metal interconnection of a semiconductor device and a method for manufacturing the same, capable of improving the reliability of the semiconductor device. The metal interconnection of the semiconductor device includes a first metal interconnection formed on a semiconductor substrate; an interlayer dielectric layer formed on the semiconductor substrate including the first metal interconnection, the interlayer dielectric layer being selectively removed to form a via hole and a trench on the via hole; a metal diffusion blocking layer formed in the via hole and the trench formed on the via hole; a second metal interconnection buried in the via hole and the trench below a top portion of the metal diffusion blocking layer; and a protection layer covering the interlayer dielectric layer, the metal diffusion blocking layer, and the second metal interconnection.

5 Claims, 5 Drawing Sheets

METAL INTERCONNECTION OF SEMICONDUCTOR DEVICE AND METHOD FOR FORMING THE SAME

RELATED APPLICATION(S)

This application claims priority under 35 U.S.C. §119(e) of Korean Patent Application No. 10-2005-0134403 filed Dec. 29, 2005, which is incorporated herein by reference in its entirety.

FIELD OF THE INVENTION

The present invention relates to a metal interconnection of a semiconductor device.

BACKGROUND OF THE INVENTION

Generally, when manufacturing a semiconductor, the most used metal materials are aluminum and aluminum alloys. This is because aluminum and aluminum alloys have superior conductivity and a superior adhesive force with an oxide layer, and they can be easily molded.

However, aluminum and aluminum alloys have problems such as electric material migration, hillocks, and spikes.

In detail, if a current is applied to aluminum for a metal interconnection, the diffusion of aluminum atoms may occur in a high-current density area such as an area in contact with silicon or a step area. The diffusion causes a metal line of aluminum existing in the high-current density area to narrow such that a short occurs, which is called "an electric material migration". Such an electric material migration occurs after a long elapse of time of operation because the aluminum atoms diffuse slowly.

In order to solve such problems, aluminum-copper alloys made by adding a small amount of copper (Cu) to aluminum (Al) must be employed, a step coverage must be improved, or a wide contact area must be designed.

Another problem occurs during an alloying process. In other words, when a heat treatment process is performed, silicon migrates to an aluminum thin film, and an excessive reaction occurs in a predetermined local area, causing a device to be destructed, which is called "a spike phenomenon".

The spike problem may be solved by employing aluminum-silicon alloys, in which silicon is added by more than a predetermined solubility or by inserting a metal thin film such as TiW or PtSi between aluminum and silicon so as to form a diffusion barrier.

Accordingly, the development of alternative materials for the metal interconnection has been required. Copper (Cu), gold (Au), silver (Ag), cobalt (Co), chromium (Cr), and nickel (Ni) having superior conductivity exists as the alternative materials. Copper and copper alloys, which have low resistivity, superior reliability for electro migration (EM) and stress migration (SM), and economical manufacturing costs, have been widely used.

Accordingly, copper is deposited in a via hole (or a contact hole) and a trench having a single damascene structure or a dual damascene structure so that a plug and a metal interconnection are simultaneously formed, and then undesirable copper remaining on the surface of a wafer is removed through a chemical mechanical polishing (CMP) process.

Hereinafter, a method for forming a conventional metal interconnection of a semiconductor device will be described with reference to accompanying drawings.

FIGS. 1A to 1E are sectional views showing the method for forming the conventional metal interconnection of the semiconductor device.

Referring to FIG. 1A, a first copper thin film is formed on the semiconductor substrate 11 and is selectively removed through a photolithography process, thereby forming a first copper interconnection 12.

Thereafter, a nitride layer 13 is formed on the entire surface of the semiconductor substrate 11 including the first copper interconnection 12, and an interlayer dielectric layer 14 is formed on the nitride layer 13.

The nitride layer 13 is used as an etching stop layer, and the interlayer dielectric layer 14 includes a low K material.

Then, after coating a first photoresist 15 on the interlayer dielectric layer 14, the first photoresist 15 is patterned through an exposure and development process, thereby defining a contact area.

Then, the interlayer dielectric layer 14 is selectively removed by using the first photoresist 15 as a mask and the nitride layer 13 as an etching end point, thereby forming a via hole 16.

Referring to FIG. 1B, the first photoresist 15 is removed, a second photoresist 17 is coated on the entire surface of the semiconductor substrate 11 including the via hole 16, and the second photoresist 17 is patterned through an exposure and development process.

Subsequently, the interlayer dielectric layer 14 is selectively removed from the surface of the resultant structure by a predetermined thickness using the second photoresist 17 as a mask, thereby forming a trench 18.

Referring to FIG. 1C, the second photoresist 17 is removed, and the nitride layer 13 remaining at the lower part of the via hole 16 is etched off.

Thereafter, a metal diffusion blocking layer 19 is formed on the entire surface of the semiconductor substrate 11 including the trench 18 and the via hole 16 by using conductive materials such as titanium (Ti) or titanium nitride (TiN).

Thereafter, a copper (Cu) seed layer is formed on the metal diffusion blocking layer 19, and then a second copper thin film 20a is formed through an electroplating scheme.

Referring to FIG. 1D, a CMP process is performed with respect to the entire surface of the second copper thin film 20a by employing the upper surface of the interlayer dielectric layer 14 as a polishing stop layer, so that the second copper thin film 20a and the metal diffusion blocking layer 19 are selectively polished. Accordingly, a second copper interconnection 20 is formed in the trench 18 and the vial hole 16.

Referring to FIG. 1E, after performing the CMP process, a silicon nitride (SiN) capping layer and a dielectric material are deposited on the interlayer dielectric layer 14, thereby forming a protection layer 22.

However, the method for the conventional metal interconnection of a semiconductor device has the following problems.

In detail, if the silicon nitride (SiN) capping layer and the dielectric material are deposited right after the CMP process so as to form the protection layer 22, CMP residues are created between the copper interconnection 20 and the protection layer 22 adjacent to the copper interconnection 20. Therefore, a micro-bridge may be formed in the reliability test of the semiconductor device. Accordingly, semiconductor defects may be caused.

In addition, the second copper interconnection diffuses toward the dielectric material due to a problem related to a bonding force of the nitride silicon capping layer, so characteristics such as electro migration (EM) and stress migration (SM) may be degraded.

BRIEF SUMMARY

Accordingly, it is an object of embodiments of the present invention to provide a metal interconnection of a semiconductor device and a method for forming the same, capable of improving the reliability of the semiconductor device by completely removing residues between metal interconnections.

In order to accomplish the object of the present invention, there is provided a metal interconnection of a semiconductor device including a first metal interconnection formed on a semiconductor substrate, an interlayer dielectric layer formed on the semiconductor substrate including the first metal interconnection, a metal diffusion blocking layer formed in a via hole and a trench formed on to the via hole by selectively removing the interlayer dielectric layer, a second metal interconnection buried in the via hole and the trench lower than a top portion of the metal diffusion blocking layer, and a protection layer covering the interlayer dielectric layer, the metal diffusion blocking layer, and the second metal interconnection.

In addition, according to another embodiment of the present invention, there is provided a method for forming a metal interconnection of a semiconductor device, including the steps of: forming a first metal interconnection on a semiconductor substrate, forming an interlayer dielectric layer on the semiconductor substrate including the first metal interconnection, forming a via hole and a trench on the via hole by selectively removing the interlayer dielectric layer, forming a metal diffusion blocking layer on the interlayer dielectric layer formed with the trench and the via hole, forming a second metal film on the metal diffusion blocking layer, forming a second metal interconnection lower than the interlayer dielectric layer in the trench and the via hole by selectively etching the second metal film and the metal diffusion blocking layer through a chemical mechanical polishing (CMP) process, etching the interlayer dielectric layer through an etching process corresponding to a height of the second metal interconnection, and forming a protection layer covering the etched interlayer dielectric layer, the metal diffusion blocking layer, and the second metal interconnection.

DETAILED DESCRIPTION OF THE INVENTION

Hereinafter, a metal interconnection of a semiconductor device and a method for forming the same according to a preferred embodiment of the present invention will be described in detail with reference to accompanying drawings.

Figure 1A:
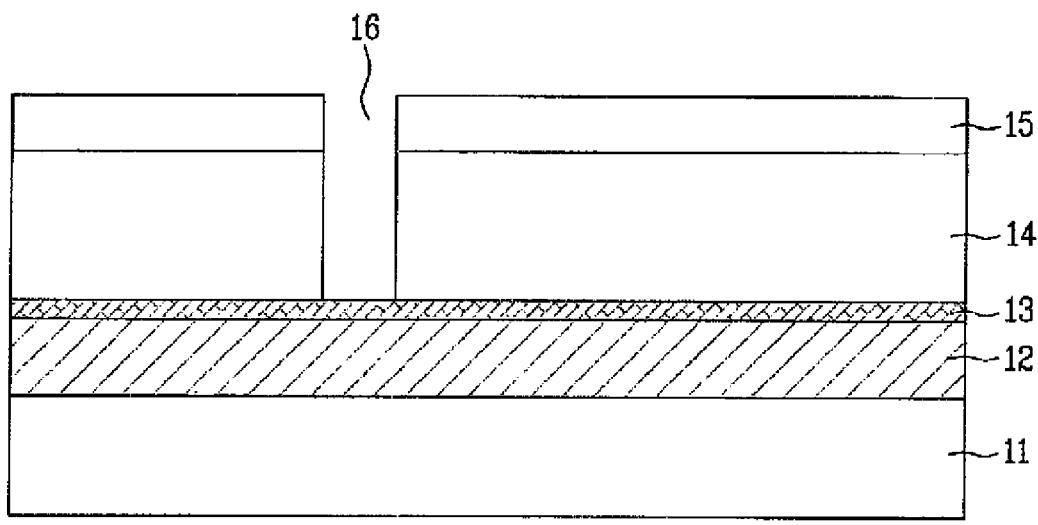
FIGS. 1A to 1E are sectional views showing a method for forming a conventional metal interconnection of a semiconductor device.
Figure 1B:
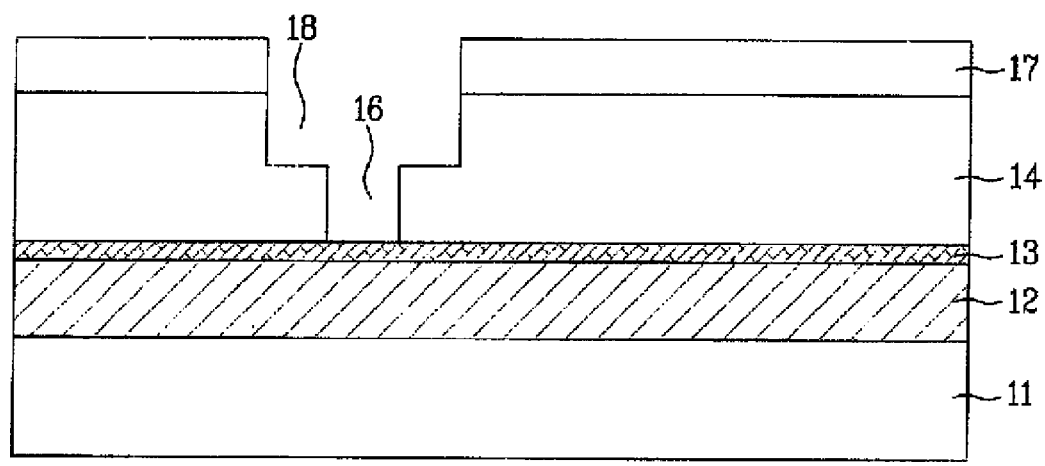
Figure 1C:
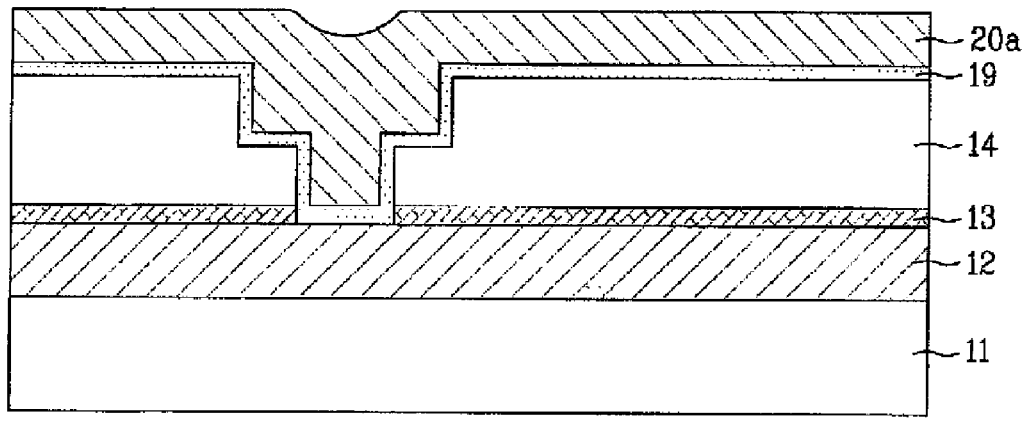
Figure 1D:
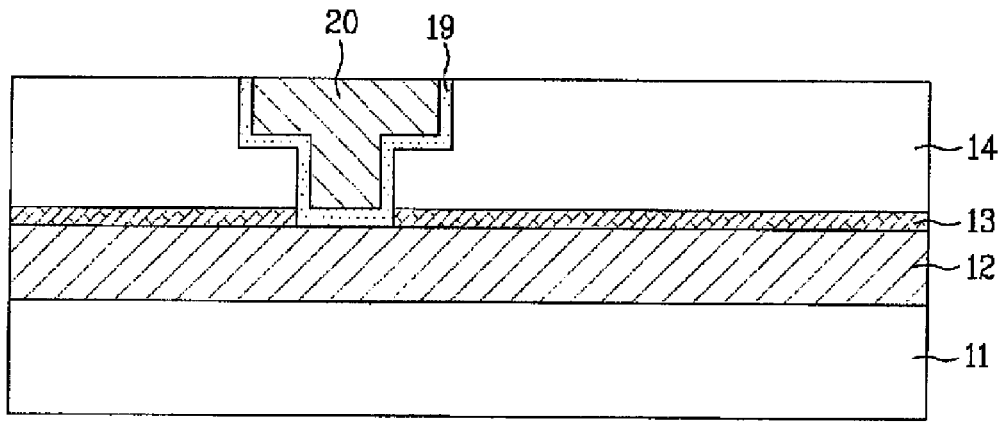
Figure 1E:
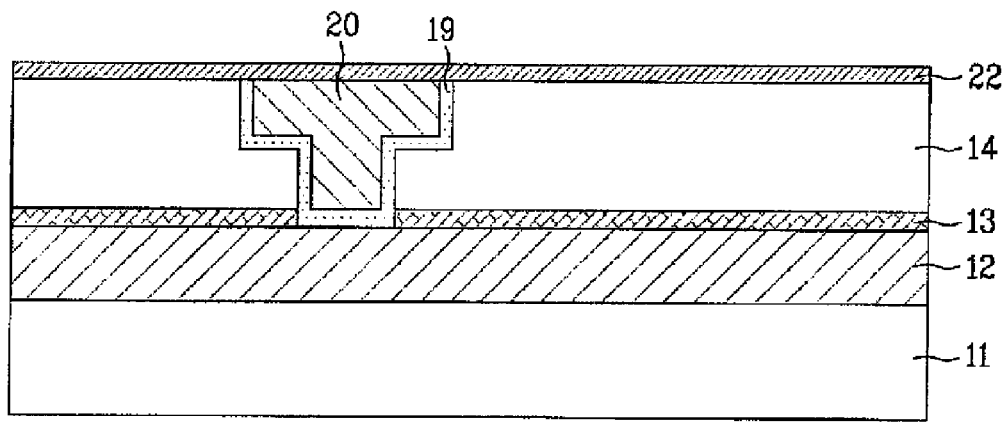
Figure 2:
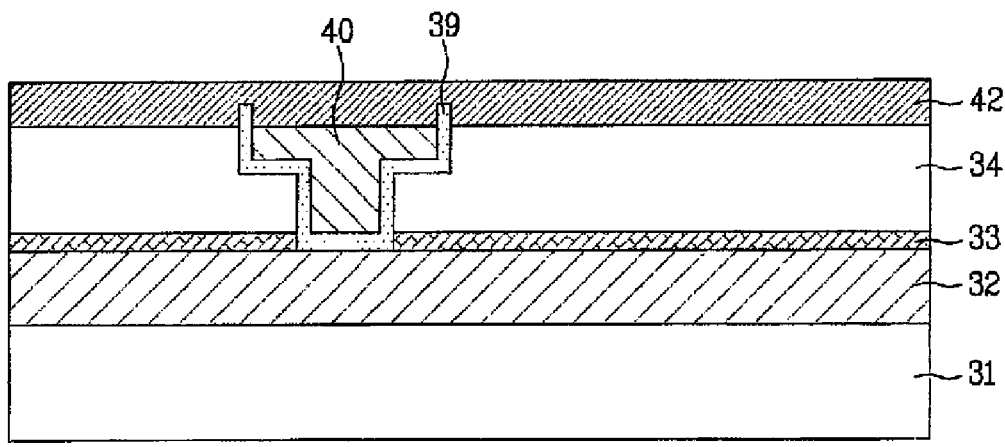
FIG. 2 is a sectional view showing a metal interconnection of a semiconductor device according to an embodiment of the present invention.

FIG. 2 is a sectional view showing a metal interconnection of a semiconductor device according to an embodiment of the present invention.

As shown in FIG. 2, a first copper interconnection 32 is formed on a semiconductor substrate 31; a nitride layer 33 is formed on the entire surface of the semiconductor substrate 31 including the first copper interconnection 32; an interlayer dielectric layer 34 is formed on the nitride layer 33; a metal diffusion blocking layer 39 is formed in a via hole and a trench formed on the via hole, which are formed by selectively removing the interlayer dielectric layer 34, a second copper interconnection 40 is buried in the via hole and the trench through a chemical mechanical polishing (CMP) process to be lower than the metal diffusion blocking layer 39 by a height of about 30 nm to about 50 nm; and a protection layer is formed on the interlayer dielectric layer 34 etched through an etching process by a depth of about 30 nm to about 50 nm, the metal diffusion blocking layer 39, and the second copper interconnection 40.

The second copper interconnection 40 can be formed through an electroplating scheme after forming a copper (Cu) seed layer on the metal diffusion blocking layer 39.

In addition, the second copper interconnection 40 and the metal diffusion blocking layer 39 can be selectively polished through a CMP process, thereby forming the second copper interconnection 40 lower than the metal diffusion blocking layer 39 by a height of about 30 nm to about 50 nm.

When the CMP process is performed, a removal rate for copper can be made relatively higher as compared with a removal rate for the interlayer dielectric layer 34 or the metal diffusion blocking layer 39, so that the second copper interconnection 40 formed in the via hole and the trench can be lower than the metal diffusion blocking layer 39 by, for example, a height of about 30 nm to about 50 nm.

The protection layer 42 can be formed on the interlayer dielectric layer 34 etched through an etching process by a depth of about 30 nm to about 50 nm, the metal diffusion blocking layer 39, and the second copper interconnection 40, after performing the CMP process.

In addition, the protection layer 42 can be formed by depositing a silicon nitride (SiN) capping layer and a dielectric material on the interlayer dielectric layer 34, which is etched through an etching process, the metal diffusion blocking layer 39, and the second copper interconnection 40.

FIGS. 3A to 3G are sectional views showing a method for forming a metal interconnection of a semiconductor device according to an embodiment of the present inventions.

Figure 3A:
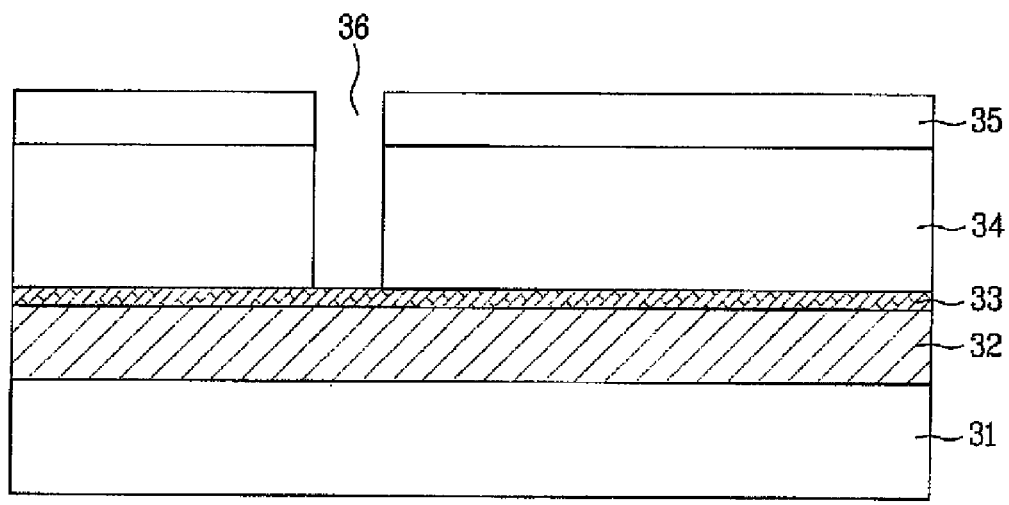
FIGS. 3A to 3G are sectional views showing a method for forming a metal interconnection of a semiconductor device according to an embodiment of the present invention.

Referring to FIG. 3A, a first copper thin film can be formed on a semiconductor substrate 31 (or dielectric layer), and can be selectively removed through a photolithography and etching process, thereby forming a first copper interconnection 32.

Thereafter, a nitride layer 33 can be formed on the entire surface of the semiconductor substrate 31 including the first copper connection 32, and an interlayer dielectric layer 34 can be formed on the nitride layer 33.

The nitride layer 33 can be used as an etching stop layer, and the interlayer dielectric layer 34 can include a low K material or an ultra low k material (k<2.5).

Then, after coating a first photoresist 35 on the interlayer dielectric layer 34, the first photoresist 35 can be patterned by an exposure and development process, thereby defining a contact area.

Then, the interlayer dielectric layer 34 can be selectively removed using the first photoresist 35 as a mask and the nitride layer 33 as an etching end point, thereby forming a via hole 36.

Figure 3B:
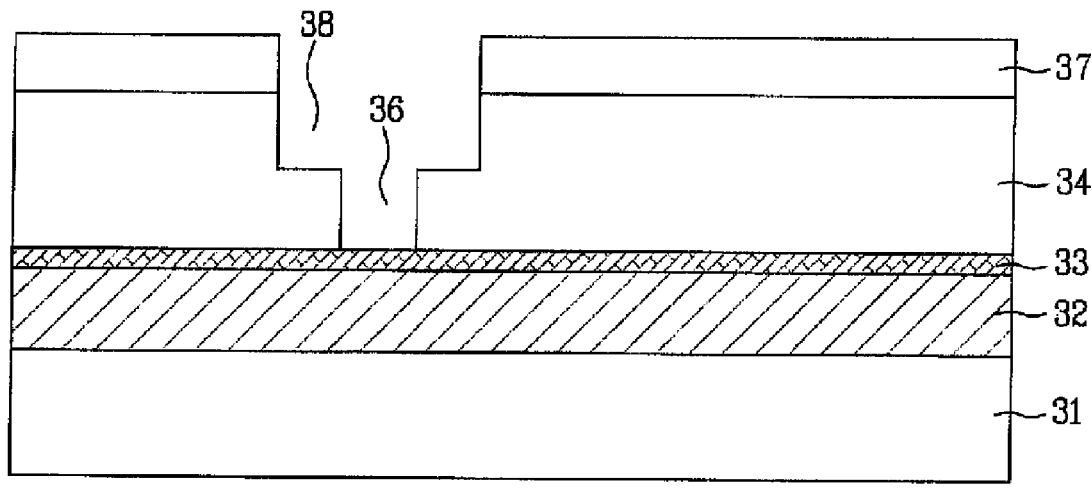

Referring to FIG. 3B, the first photoresist 35 can be removed, a second photoresist 37 can be coated on the entire surface of the semiconductor substrate 31 including the via hole 36, and the second photoresist 37 can be patterned by an exposure and development process.

Subsequently, the interlayer dielectric layer 34 can be selectively removed from the surface of the resultant structure by a predetermined thickness using the second photoresist 37 as a mask, thereby forming a trench 38.

Thereafter, the second photoresist 37 can be removed, and the nitride layer 33 remaining at the lower part of the via hole 36 can be etched off.

In an embodiment, the nitride layer 33 can be etched off using the second photoresist 37 as a mask, or by using the interlayer dielectric layer 34 as a mask.

Figure 3C:
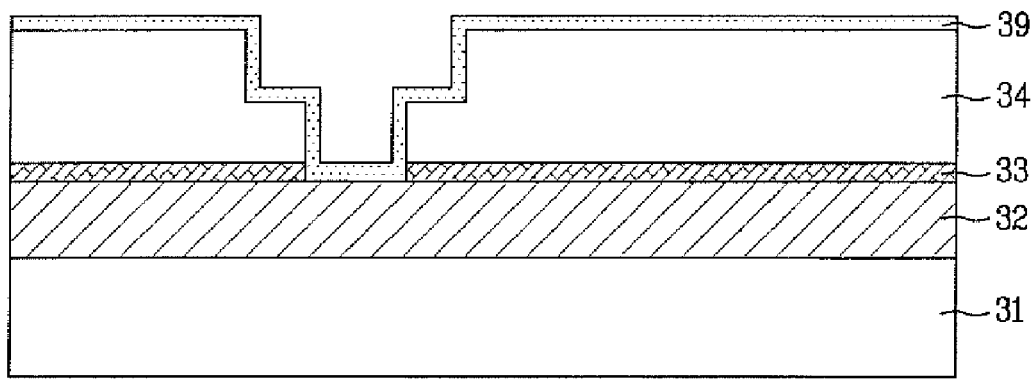

Referring to FIG. 3C, a metal diffusion blocking layer 39 can be formed on the entire surface of the semiconductor substrate 31 including the trench 38 and the via hole 36. The metal diffusion blocking layer 39 can be formed of conductive materials such as titanium (Ti) or titanium nitride (TiN).

Figure 3D:
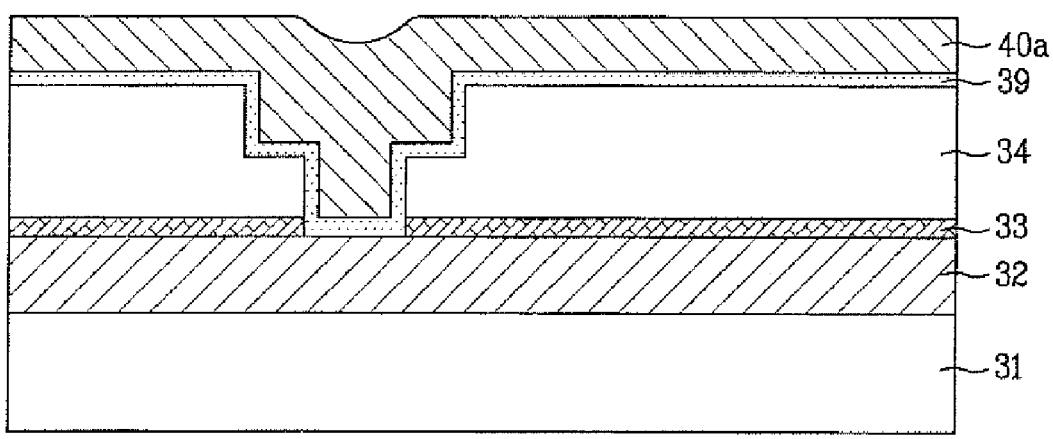

Referring to FIG. 3D, a copper (Cu) seed layer can be formed on the metal diffusion blocking layer 39, and then a second copper thin film 40a can be formed through an electroplating scheme.

Figure 3E:
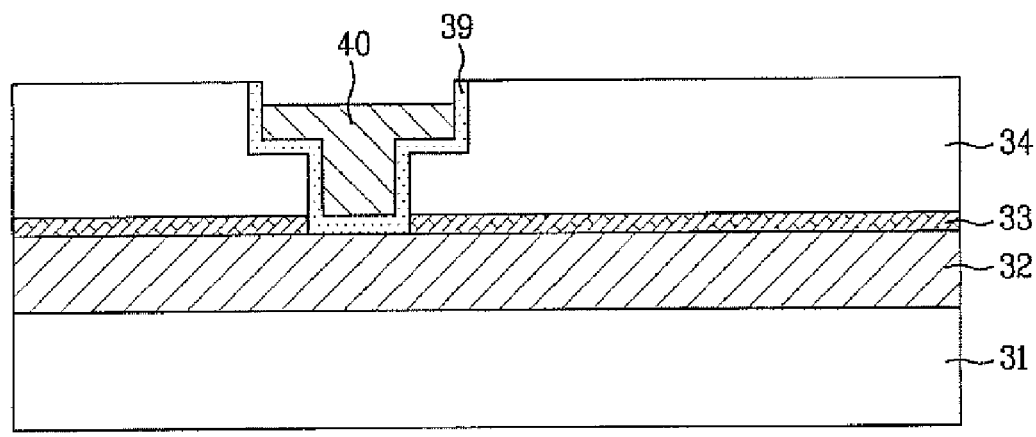

Referring to FIG. 3E, a CMP process is performed with respect to the entire surface of the second copper thin film 40a while employing the upper surface of the interlayer dielectric layer 34 as a polishing stop layer. The second copper thin film 40a and the metal diffusion blocking layer 39 can be polished/etched selectively by the CMP process, thereby forming a second copper interconnection 40 in the trench 38 and the via hole 36, which is lower than the metal diffusion blocking layer 39 by a height of, for example, about 30 nm to about 50 nm.

When the CMP process is performed, the removal rate for copper can be made relatively higher as compared with the removal rate for the interlayer dielectric layer 34 or the metal diffusion blocking layer 39, so that the second copper interconnection 40 formed in the via hole and the trench can be lower than the metal diffusion blocking layer 39.

Figure 3F:
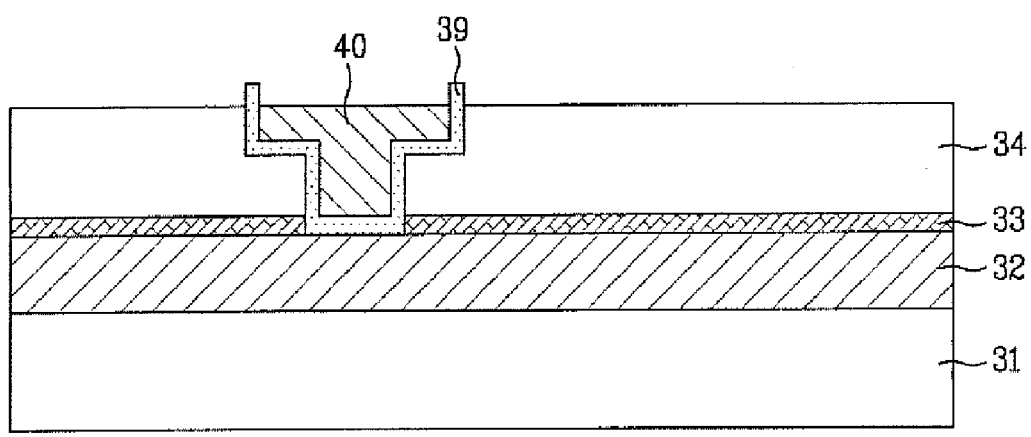

As shown in FIG. 3F, after performing the CMP process, an etching process can be performed to etch the interlayer dielectric layer 34. The interlayer dielectric layer 34 can be etched to a depth of about 30 nm to about 50 nm.

In one embodiment, the interlayer dielectric layer 34 can be etched by the etching process after the CMP process such that the height of the interlayer dielectric layer 34 corresponds to the height of the copper interconnection 40. In a specific embodiment, both the interlayer dielectric layer 34 and the copper interconnection 40 can be about 30 nm to about 50 nm from a top portion of the metal diffusion blocking layer 39.

Figure 3G:
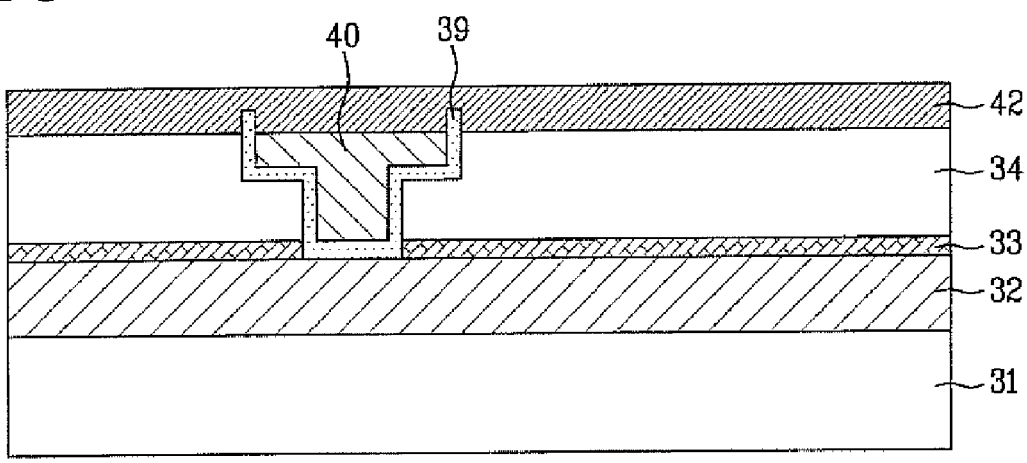

Referring to FIG. 3G, a silicon nitride (SiN) capping layer and a dielectric material can be deposited on the interlayer dielectric layer 34, which is etched through an etching process, the metal diffusion blocking layer 39, and the second copper interconnection 40, thereby forming a protection layer 42.

The protection layer 42 can be formed by depositing the silicon nitride (SiN) capping layer and the dielectric material on the interlayer dielectric layer 34, which is etched through the etching process, the metal diffusion blocking layer 39, and the second copper interconnection 40.

As described above, the metal interconnection of the semiconductor device and the method for forming the same according to embodiments of the present invention have the following advantages.

The second copper interconnection, which is formed in the via hole and the trench, can be formed lower than the metal diffusion blocking layer by a height of about 30 nm to about 50 nm through the CMP process, and the interlayer dielectric layer can be etched corresponding to the height of the second copper interconnection. Then, the silicon nitride (SiN) capping layer and the dielectric material can be deposited on the interlayer dielectric layer so as to form the protection layer, such that CMP residues between the second copper interconnections can be completely removed. Accordingly, it is possible to prevent a micro-bridge phenomenon in the reliability test of the semiconductor device.

In addition, since the metal diffusion blocking layer extends into the protection layer including silicon nitride (SiN), a capping function for the diffusion of copper can be enhanced, so that it is possible to improve the characteristics of the semiconductor device such as electro migration (EM) and stress migration (SM).

While the invention has been shown and described with reference to certain preferred embodiments thereof, it will be understood by those skilled in the art that various changes in form and details may be made therein without departing from the spirit and scope of the invention as defined by the appended claims.

I claim:

1. A method for forming a metal interconnection of a semiconductor device, comprising:
   forming a first metal interconnection on a semiconductor substrate;
   forming an interlayer dielectric layer on the semiconductor substrate including the first metal interconnection;
   forming a via hole and a trench on the via hole by selectively removing the interlayer dielectric layer;
   forming a metal diffusion blocking layer on the interlayer dielectric layer formed with the trench and the via hole;
   forming a second metal film on the metal diffusion blocking layer;
   selectively polishing the second metal film and the metal diffusion blocking layer through a chemical mechanical polishing (CMP) process to form a second metal interconnection in the via hole and the trench below a top portion of the metal diffusion blocking layer such that the top surface of the second metal interconnection is recessed below the top surface of the metal diffusion blocking layer;
   etching the interlayer dielectric layer by an etching process to a depth corresponding to a height of the second metal interconnection; and
   forming a protection layer covering the etched interlayer dielectric layer, the metal diffusion blocking layer, and the second metal interconnection.

2. The method according to claim 1, wherein the second metal interconnection is formed below the top portion of the metal diffusion blocking layer by a height of about 30 nm to about 50 nm according to different removal rates of the CMP process.

3. The method according to claim 2, wherein the interlayer dielectric layer is etched to a depth below the top portion of the metal diffusion blocking layer corresponding to the height of the second metal interconnection after the CMP process.

4. The method according to claim 3, wherein the interlayer dielectric layer is etched to have a same height as the second metal interconnection.

5. The method according to claim 1, wherein etching the interlayer dielectric layer by an etching process to a depth corresponding to a height of the second metal interconnection comprises etching the interlayer dielectric layer to the same depth as the second metal interconnection below the top surface of the metal diffusion blocking layer.

* * * * *